United States Patent
Lorenz

(10) Patent No.: US 11,193,208 B2
(45) Date of Patent: Dec. 7, 2021

(54) WAFER/SUPPORT ARRANGEMENT, METHOD FOR PRODUCING THE ARRANGEMENT, AND USE OF THE ARRANGEMENT IN THE PROCESSING OF THE WAFER

(71) Applicant: NISSAN CHEMICAL INDUSTRIES, LTD., Tokyo (JP)

(72) Inventor: Phillipp Lorenz, Munich (DE)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 670 days.

(21) Appl. No.: 15/513,369

(22) PCT Filed: Sep. 22, 2015

(86) PCT No.: PCT/IB2015/057291
§ 371 (c)(1),
(2) Date: Mar. 22, 2017

(87) PCT Pub. No.: WO2016/046741
PCT Pub. Date: Mar. 31, 2016

(65) Prior Publication Data
US 2017/0298506 A1    Oct. 19, 2017

(30) Foreign Application Priority Data
Sep. 22, 2014  (DE) .................. 102014219095.9

(51) Int. Cl.
*H01L 21/687*   (2006.01)
*C23C 16/458*   (2006.01)
(Continued)

(52) U.S. Cl.
CPC ....... *C23C 16/4586* (2013.01); *B01J 19/0046* (2013.01); *H01L 21/687* (2013.01);
(Continued)

(58) Field of Classification Search
CPC ............ H01L 21/6835; H01L 21/6875; H01L 21/687; H01L 21/68728; H01L 21/68735;
(Continued)

(56) References Cited

U.S. PATENT DOCUMENTS

2005/0233543 A1* 10/2005 Wei ................... H01L 21/2007
438/455
2010/0043608 A1*  2/2010 Jakob ............... H01L 21/67132
83/13

FOREIGN PATENT DOCUMENTS

DE       10353530 A1    6/2005
WO    2004/051708 A2    6/2004
(Continued)

OTHER PUBLICATIONS

Atanacio A J et al., "Mechanical properties and adhesion characteristics of hybrid sol-gel thin films", Surface & Coatings Technology, vol. 192, No. 2-3, pp. 354-364, 2005.
(Continued)

*Primary Examiner* — Thanh T Nguyen
(74) *Attorney, Agent, or Firm* — Oliff PLC

(57) ABSTRACT

A wafer/support arrangement, including a wafer, a support system, which includes a support and an elastomer layer, and a connecting layer, wherein the connecting layer is a sol-gel layer. The invention further relates to a coated wafer for a wafer/support arrangement according to the invention, wherein a sol-gel layer is used as a connecting layer for a corresponding wafer/support assembly, and to a method for processing the back side of a wafer.

15 Claims, 4 Drawing Sheets

(51) Int. Cl.
*H01L 21/683* (2006.01)
*B01J 19/00* (2006.01)

(52) U.S. Cl.
CPC ...... H01L 21/6835 (2013.01); H01L 21/6875 (2013.01); H01L 21/68728 (2013.01); H01L 21/68735 (2013.01); *H01L 2221/6834* (2013.01); *H01L 2221/68318* (2013.01); *H01L 2221/68327* (2013.01); *H01L 2221/68381* (2013.01)

(58) Field of Classification Search
CPC . H01L 2221/68318; H01L 2221/68327; H01L 2221/6834; H01L 2221/68381; C23C 16/4586; B01J 19/0046
See application file for complete search history.

(56) References Cited

FOREIGN PATENT DOCUMENTS

| | | |
|---|---|---|
| WO | 2007/009946 A2 | 1/2007 |
| WO | 2010/061004 A1 | 6/2010 |
| WO | 2012/081646 A1 | 6/2012 |

OTHER PUBLICATIONS

Kohei Watanuki et al., "Evaluation of Narrow Gap Filling Ability in Shallow Trench Isolation by Organosiloxane Sol-Gel Precursor", ECS Transactions, pp. 135-143, 2010, vol. 33(3).

Sep. 27, 2015 Written Opinion issued in International Patent Application No. PCT/IB2015/057291.

Nov. 27, 2015 International Search Report issued in International Patent Application No. PCT/IB2015/057291.

* cited by examiner

WAFER/SUPPORT ARRANGEMENT, METHOD FOR PRODUCING THE ARRANGEMENT, AND USE OF THE ARRANGEMENT IN THE PROCESSING OF THE WAFER

TECHNICAL FIELD

The present invention relates to a wafer/support arrangement, comprising a wafer, a support system, which comprises a support and an elastomer layer, and a connecting layer, wherein the connecting layer is a sol-gel layer. The invention further relates to a coated wafer for a wafer/support arrangement according to the invention, wherein a sol-gel layer is used as a connecting layer for a corresponding wafer/support assembly, and to a method for processing the back side of a wafer.

BACKGROUND

Currently there is a high demand for the thinnest possible electronic components and circuits. In the production of such electronic components and circuits (diodes, transistors, ICs, sensors, etc.), structures and layers for producing the required electronic functions are applied to wafers (possibly doped discs made of silicon, gallium arsenide, etc.) by means of different technologies. At present, after, conclusion of the necessary manufacturing steps these wafers are provided on the front side (that is, the active side or the side on which the applied structures are located) with a protective film or another protective layer. The function of this film or layer is to protect the front side of the wafer, and in particular the electrical and mechanical structures applied thereto, during the subsequent thinning and/or other processing of the back side of the wafer. The thinning takes place by techniques such as grinding, lapping, abrading, etching or comparable processing on the back side of the wafer.

The aim of this procedure is to reduce the original thickness of the wafer. In this case the extent of the reduction is crucially determined by the mechanical and thermal stresses to be expected during the thinning and/or the further subsequent process steps: Since the wafer, when it is thinned, has already undergone a plurality of process steps, it already represents a substantial financial value. Therefore, the risk of breaking of the wafer must be kept as low as possible. Accordingly, thinning to the extent which would actually be required is often not possible, since otherwise the losses occurring due to breaking of the wafer are too high.

According to the prior art, after the thinning a chemical treatment of the back side of the wafer is frequently carried out in order to improve the fracture properties of the wafer. After any cleaning stages the protective film is withdrawn from the top side of the wafer or is removed in some other way. This is then followed by further manufacturing steps and/or measures for improving the properties of the wafer as well as tests, for example for quality control. The back side of the thinned wafer is coated with a metallic layer. This coating process generally takes place by means of sputtering or similar deposition processes in a vacuum and frequently causes thermal stress.

Afterwards the wafer with the back side facing downwards (top side upwards) is placed onto a sawing film, an expansion film or a frame. Next the separation of the wafers takes place, i.e. the wafer is divided into separate components (chips, dice). This separation frequently takes place by means of rotating cutting discs or other mechanical sawing devices. However, laser cutting processes can also be used. Alternatively, the wafers are also broken during the separation, wherein auxiliary processes such as scoring may sometimes be used.

For the aforesaid reasons it is very difficult with the conventional methods to handle or to produce very thin wafers. These difficulties result inter alia from the fact that the wafer must be exposed to mechanical stresses during and after the thinning. These stresses occur inter alia:

during the thinning of the wafer, wherein the wafer when it is very highly thinned tends to curl, during the withdrawal of the protective film or the protective layer which protects the front side of the wafer during the thinning, during the placing of the wafer onto the sawing film and during the transport between the individual manufacturing steps, but in particular during the coating of the back side, wherein at least thermal stresses also occur when the back side coating already takes place after the separation of the wafer.

As an alternative to the aforesaid methods, nowadays methods are also used in which, before the thinning process, the wafer is already structured on the front side by means of grinding of scoring structures, scoring, chemical etching, plasma etching of grooves and/or structures so that during the subsequent thinning process these structures can be achieved by means of mechanical and/or chemical processes on the back side, so that the wafer is separated.

An alternative in the aforementioned techniques for thinning and further processing of the wafer is disclosed in unexamined patent application DE 103 53 530 and WO 2004/051708: In these documents it is proposed to use a separating layer and a support layer for the thinning and subsequent processing of the wafer, wherein the separating layer is a plasma polymer layer which adheres more firmly to the support layer than to the wafer. Due to the adhesion or dehesion properties of the plasma polymer layer which can be adjusted by the person skilled in the art on the basis of the plasma polymerization process, it is possible to configure the layer so that it has greater adhesion to the support layer than to the wafer. In this case the strength of the adhesion to the wafer can be set so that even a very thin wafer can be released from the separating layer (and the support layer) without excessively high mechanical stresses occurring.

A disadvantage of the method disclosed in the aforesaid documents is that the support layer proposed there is not optimally adapted: In particular in three-dimensionally structured wafer surfaces (such as, for example, wafers provided with bumps or wafers with an undercut on their surface) the proposed support layer (for example polyimide or polyamide) is too hard: Since the plasma polymer separating layer covers the surface structures of the wafer substantially with a layer of constant thickness, intermediate spaces such as undercuts or intermediate spaces between the bumps should be filled by the material for the support layer. If this is the case, however, because of the hardness of the support layer it happens that the support layer cannot be non-destructively detached from the wafer again. If the support layer does not fill the surface structures, hollow spaces remain which have a negative influence on the adhesion between the substrate layer and the separating layer and can lead to undesirable inclusions. In addition, because of different coefficients of thermal expansion of the support layer and the wafer, additional mechanical stress is generated for the wafer.

In WO 2007109946 A1 a cutting method is disclosed in which thinned wafers can be cut mechanically after thinning.

This is made possible by the use of a plasma polymer separating layer in combination with an elastomer layer.

SUMMARY

Against the background of the prior art, it was the object of the present invention to provide an improved wafer/support arrangement which enables mechanical cutting of a processed wafer, in particular after thinning, without the wafer being damaged thereby. In this case it was desirable that the least possible technical expenditure is needed for production of the wafer/support arrangement, in particular with regard to the equipment used.

This object is achieved according to the invention by a wafer/support arrangement comprising a wafer,
a support system, comprising a support and an elastomer layer, wherein the elastomer layer is aligned with the wafer, and
a connecting layer, wherein the connecting layer is a sol-gel layer which can be produced from the monomers
(1) $Si(OR1)_4$,
and one, two or all of the following monomers
(2) $Si(OR1)_3R2$,
(3) $Si(OR1)_2R3R4$ and
(4) $Si(OR1)R5R6R7$
wherein each R1 independently of the others represents H or a $C_1$-$C_8$ alkyl group, R2, R3, R4, R5, R6 and R7 in each case independently of one another represent a $C_1$-$C_{20}$ alkyl group, a fluorinated $C_1$-$C_{20}$ alkyl group, a $C_1$-$C_{20}$ aminoalkyl group, a $C_2$-$C_{20}$ alkenyl group, an aryl group, a fluorinated aryl group, a single, double or triple $C_1$-$C_4$ alkylated aryl, wherein the alkylations are independent of one another with regard to their number of C atoms and/or wherein the group can also be fluorinated, or can represent a $C_3$-$C_{20}$ epoxy group.

In this case a wafer preferably comprises electronic components on its front side, wherein this front face is protected by the connecting layer to be used according to the invention.

DETAILED DESCRIPTION

Figure 1A:
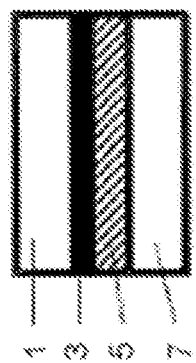
FIG. 1A, FIG. 1B, and FIG. 1C show schematically the production of a wafer/support arrangement according to an embodiment.

According to the invention a wafer/support arrangement is preferred, wherein in the connecting layer each independently of the others represents H or a $C_1$-$C_5$ alkyl group and/or R2, R3, R4, R5, R6 and R7 in each case independently of one another represent a $C_1$-$C_8$ alkyl group, a fluorinated $C_1$-$C_8$ alkyl group, a $C_1$-$C_8$ aminoalkyl group, a $C_2$-$C_8$ alkenyl group, an aryl group, a fluorinated aryl group, a single, double or triple $C_1$-$C_4$ alkylated aryl, wherein the alkylations are independent of one another with regard to their number of C atoms and/or wherein the group can also be fluorinated, or can represent a $C_3$-$C_8$ epoxy group.

Preferred solvents in the production of the connecting layers are selected from the group consisting of alcohols, in particular methanol, ethanol, propanol, butanol, pentanol, water, aprotic solvents, in particular PGMEA (1-methoxy-2-propylacetate), acetone or ethyl acetate. Particularly preferred solvents are selected from the group of alcohols, in particular 2-propanol and 2-methyl-1-propanol.

Preferred activators for the sol-gel-reaction in the production of the connecting layer are selected from the group consisting of acids and bases, in particular TMAH (tetramethylammonium hydroxide), formic acid, hydrochloric acid and sulfuric acid. Furthermore, preferred activators are Lewis acids or bases, organometallic compounds such as for example tributyl tin or also fluoride-containing compounds, such as for example TBAF (tetrabutylammonium fluoride) or cesium fluoride. Particularly preferred activators in this case are TMAH, TBAF and sulfuric acid.

It is particularly preferred that in the connecting layer according to the invention each R1 independently of the others represents H or a $C_1$-$C_3$ alkyl group and/or R2, R3, R4, R5, R6 and R7 in each case independently of one another represent a $C_1$-$C_3$ alkyl group or a fluorinated $C_3$ alkyl group.

Surprisingly, the wafer/support arrangement according to the invention can be separated again very easily and especially without great mechanical stress for the wafer. In this case it is possible to remove the sol-gel layer chemically, for example, after the separation.

The sol-gel layer to be used according to the invention has the advantage that the properties of sol-gel layers can generally be adapted to the requirements. In this case sol-gel layers are preferred which are temperature-resistant up to 450° C.≤without chemical alteration. The sol-gel layer used according to the invention is silicon-based and thus is compatible with elastomers, in particular with silicon-based elastomers. Furthermore, the connecting layer to be used according to the invention is cost-effective and non-toxic. After the polymerization the sol-gel layer is chemically constant over a long time period. Because of the monomers used, it can be easily introduced into typical wafer production processes since it can be produced, for example, from a liquid.

A wafer/support arrangement according to the invention is preferred, wherein the molar ratio of the monomers (1) to the sum of the quantities of substance of the monomers (2), (3) and (4) is 0.032 (1:31.25) to 1.6 (1.6:1) preferably 0.05 to 1 (1:20 to 1:1) and particularly preferably 0.064 to 0.5 (1:15.63 to 0.5:1).

With these molar ratios, in particular the preferred variants, particularly suitable connecting layers for the wafer/support arrangement according to the invention can be produced.

A wafer/support arrangement according to the invention is preferred in which the layer thickness of the connecting layer is 10 to 200 nm, preferably 20 to 150 nm, and particularly preferably 30 to 100 nm.

The preferred layer thicknesses enable a particularly stress-free separation of the support system from the wafer.

A wafer/support arrangement according to the invention is preferred in which the elastomer layer is an organosilicon layer.

The elastomer layer (that is to say a layer consisting of elastomer) is preferably a layer consisting of a material selected from the group consisting of methyl, phenyl, epoxyalkyl, epoxyarylalkyl silicone or silicone with mixed functionalities, for example methylphenyl silicone; silicone elastomer (catalytically) cross-linked by means of alkyl groups with at least one of the aforementioned functionalities, and mixtures thereof with silicone resins, all in each case with or without fillers.

The elastomer layer preferably has a Shore-A hardness of 40 to 100, preferably 45 to 90, more preferably 50 to 80 and particularly preferably 55 to 75. In this case the Shore hardness is determined according to DIN 53505-A-87.

A wafer/support arrangement according to the invention is preferred, wherein the surface with the lowest adhesive force in the arrangement is the interface between the connecting layer and the elastomer layer. This is also the preferred surface along which a separation takes place with an adhesive force determination according to measurement example 1.

The person skilled in the art can determine the adhesive force (adhesive strength) between the respective layers according to DIN EN ISO 4618:2007-03, and it is defined as the "totality of the bonding forces between a coating and its supporting surface." The adhesive force between the layers which produce the surface with the least adhesive force (as interface) is preferably determined according to measurement example 1.

The advantage of this particularly preferred wafer/support arrangement according to the invention resides in the fact that on the basis of the properties of the elastomer material (flexibility, expandability), an ideal connection between the elastomer layer and the connecting layer can be produced on the wafer. In particular, the adhesive strength can be produced between the connecting layer and the elastomer layer so that in the event of a separation of the wafer/support arrangement according to the invention, the elastomer material is completely detached from the connecting layer. This separation preferably takes place mechanically.

A wafer/support arrangement according to the invention is preferred, wherein the wafer on the side (front side) directed towards the connecting layer comprises electronic components.

A wafer/support arrangement according to the invention is preferred wherein the support is a glass plate or a second wafer.

In the selection of a suitable glass plate or a suitable wafer it is possible for the coefficients of thermal expansion of the support and of the wafer to be processed (the first wafer) to be adapted to one another so that in the wafer/support arrangement according to the invention no stresses or only very low stresses are produced, even when the system is heated or is exposed to evolution of heat due to mechanical stresses.

A coated wafer of a wafer/support arrangement according to the invention is also part of the invention, wherein the coating is a connecting layer, as defined above, This coated wafer can be used as a preliminary stage for the wafer/support arrangement according to the invention, wherein a support system as defined above is mounted on the connecting layer.

A coated wafer according to the invention is preferred wherein the connecting layer on the side facing away from the wafer has a static water boundary angle of ≥80°, preferably ≥83°, and/or a surface energy of 15-25 mJ/m².

The invention also relates to the use of a connecting layer as defined above for producing a wafer/support arrangement according to the invention or a coated wafer according to the invention.

Furthermore, the invention relates to a method for processing the back side of a wafer comprising the steps:

a) providing a wafer/support arrangement according to the invention, b) processing the back side of the wafer and c) mechanically separating the wafer/support arrangement along the interface between the elastomer layer and the connecting layer.

Processing of the back side of the wafer may in particular be: Metallizing, coating, thinning, TSV (through silicon via) contacting, lithographic techniques.

The mechanical separation for the method according to the invention preferably takes place as follows:

The wafer/support arrangement is fixed mechanically on both sides by means of a vacuum, the flexible fixing on the support side is raised starting from one side so that the support is detached from the wafer. This process is carried out as described in WO 002010072826 A2, in particular as described in FIG. 3 and the associated text.

A method according to the invention is preferred in which according to step c) the connecting layer is chemically removed from the wafer.

This chemical removal can take place in principle by any suitable means. In this connection it should be ensured that the connecting layer is reliably removed, whilst the wafer and in particular the electronic components which may be located on the wafer are not affected, In this case suitable means for chemical removal of the connecting layer are strong acids and lyes as well as compounds which provide fluoride ions, such as for example TBAF, CsF, HF or KHF2.

Tetrabutylammonium fluoride (TBAF) is particularly preferred for the chemical removal of the connecting layer.

TBAF is known for a plurality of applications, but until now not for the specific applications proposed here. Thus TBAF is known, for example, as a means for the removal of silyl-containing protective groups, as an activator/catalyst in the production of sol-gel systems, as a remover for silicones and as a phase transfer catalyst. In particular, an applicability to sol-gel layers has not been known hitherto in connection with the present invention.

In order to set a suitable surface energy for the connecting layer, the person skilled in the art will adopt one or more of the following measures.

The ratio of pure structure farmers, such as tetraethoxysilane (TEOS) to the silane modified by alkyl groups (modifier), such as for example methyltrimethoxysilane or phenyltrimethoxysilane, to a great extent determines the surface energy and thus the resulting adhesion forces of the intermediate layer and of the elastomer. The higher the proportion of modifier, the lower the surface energies which can be achieved. If the modifiers are replaced or supplemented by silanes with large alkyl groups such as hexadecyltrimethoxysilane or fluorinated alkyl groups, the surface energies can be still further decreased.

Both the times until activation of the mixture, and also the storage stability can be influenced by the choice of a suitable activator and the amount of this activator. In this case the lower the activator content, the longer the mixture requires for activation, but also the storage stability is significantly increased. With the reduction of the amount of activator the resulting surface energies can also be influenced: If less activator is added, the surface energies are reduced. Thus the choice of the activator also influences the resulting adhesive forces, which increase for acid-based activators such as sulfuric acid by up to 35% by comparison with TMAH-based activators. On the other hand, in the event of equimolar replacement of TMAH by TBAF the adhesive forces hardly change. Mineral and organic acids, mineral and organic bases, Lewis acids and bases, and fluoride ion-eliminating compounds can be employed as activators.

The temperature during the hardening of the connecting layer plays a role here. If a temperature is chosen which is too low, insufficient cross-linking takes place, the resulting adhesive forces are too high for a smooth separation of the support and the device wafer. At approximately 165° C. the adhesive force is at a minimum, in order then to rise again slightly above 200° C.

Figure 1B:
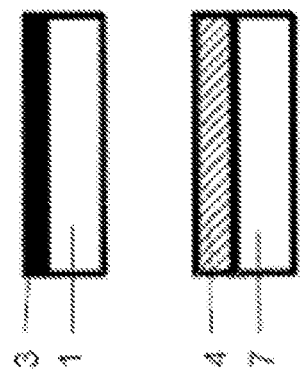
Figure 1C:
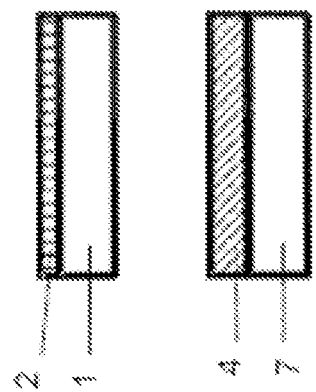
Figure 2A:
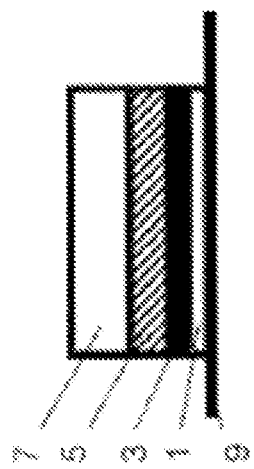
FIG. 2A, FIG. 2B, and FIG. 2C show schematically the separation of a wafer/support arrangement according to an embodiment.
Figure 2B:
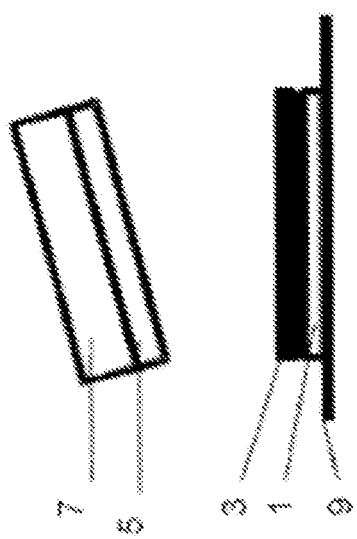
Figure 2C:
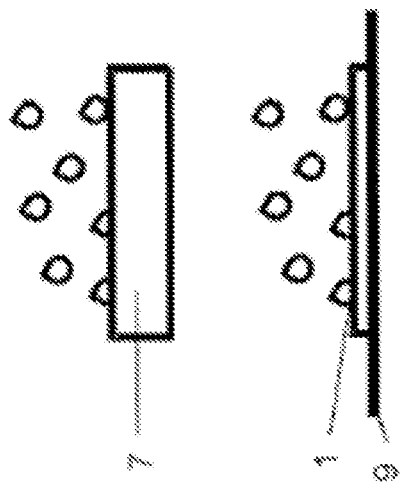

FIGS. 1A-1C show schematically the production of a wafer/support arrangement according to the invention: In this case the references represent the following:
1 wafer (possibly with electronic components)
2 connecting layer precursor (liquid)
3 connecting layer
4 elastomer (not yet cured)
5 elastomer layer
7 support FIGS. 2A-2C show schematically the separation of a wafer/support arrangement according to the invention. In this case the reference numerals have the same significance as in FIGS. 1A-1C. In addition, the following reference numeral represents
9 second support.

In FIG. 1A first of all the wafer 1 is coated on its front side with liquid monomers 2 for the connecting layer 3 (sol-gel layer). The material 4 for the elastomer layer 5 is initially still liquid.

In FIG. 1B the sol-gel layer 3 is produced by cross-linking As a rule this occurs by the action of heat.

FIG. 1C depicts the wafer/support arrangement according to the invention 1, 3, 5 in finished form, in which, starting from FIG. 1B, first of all material for the elastomer layer 4 has been applied. Subsequently the support 7 was applied to the not yet (completely) cured elastomer layer and subsequently cured in the material for the elastomer layer 4 to form the elastomer layer 5.

In FIG. 2A the already thinned wafer 1 is applied to a second support 9. The support 7 and the elastomer layer are separated mechanically from the connecting layer according to FIG. 2B. FIG. 2C shows schematically that the connecting layer 3 is chemically removed from the wafer (cleaning). At the same time the support 7 can also be freed, likewise chemically, from the groups of the elastomer layer 5.

EXAMPLES

Measurement Examples

Figure 3:
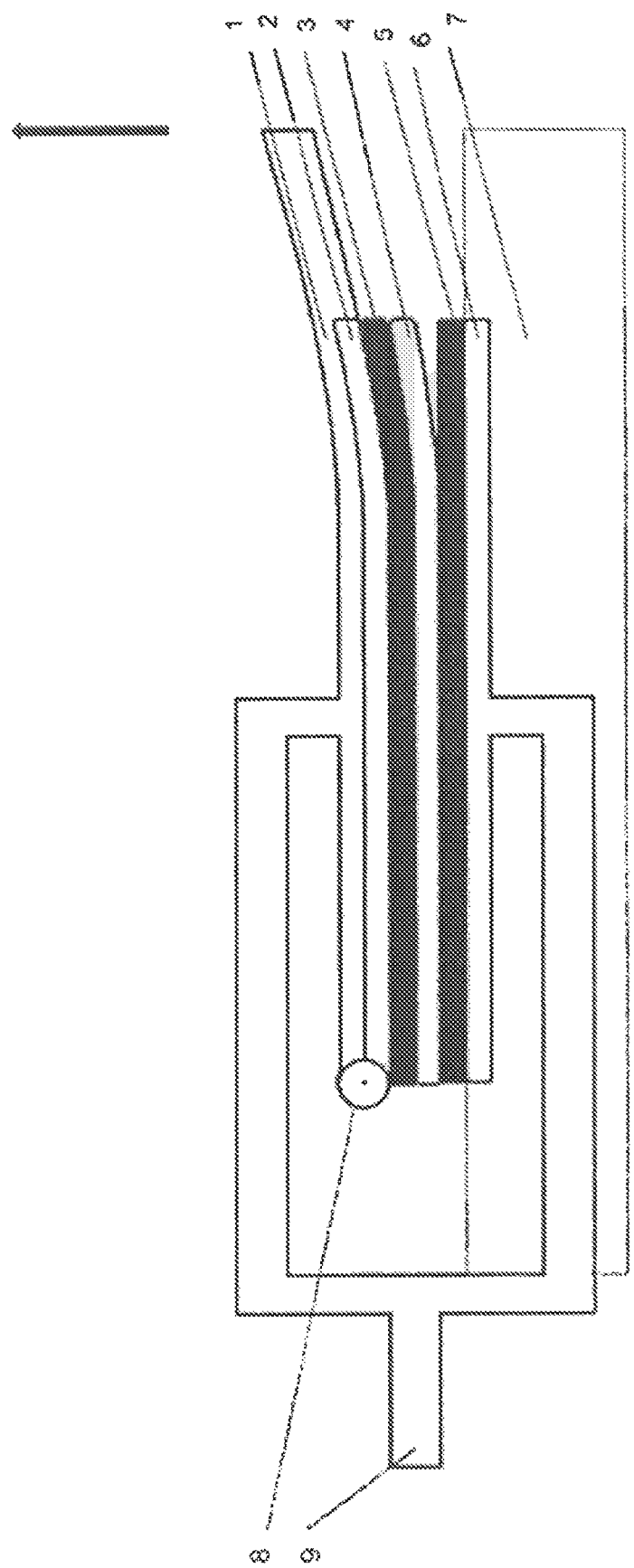
FIG. 3 is a schematic illustration of an apparatus and arrangement according to an embodiment.

Measurement Example 1:

Ascertaining the Adhesive Force Between the Connecting Layer and the Elastomer Layer The wafers connected according to FIG. 1C are introduced into an apparatus and arrangement according to FIG. 3 and fixed by means of a vacuum to the upper and lower retaining plates. In FIG. 3 the references represent the following:
1 upper retaining plate
2 upper vacuum supply
3 support
4 elastomer
5 device wafer with connecting layer (diameter 300 mm)
6 lower vacuum plate
7 lower retaining plate
8 end point
9 vacuum supply The upper retaining plate is designed to be flexible and is made of polycarbonate, brand name Makrolon®, Bayer AG, with a modulus of elasticity of 2.2-2.4 GPa. The plate is 5 mm thick, has a width of 340 mm and is 400 mm long. The retaining plate is affixed so that the introduction of force takes place on the longer side which projects beyond the wafer (diameter 300 mm).

Before the force measurement, the wafer stack is separated by lifting of this free end of the upper retaining plate in the direction of the arrow as far as the wafer half, so that the separation front which now extends transversely over the wafer has its maximum length. With the further movement of the separation front, the effective length of the free lever arm, and thus also the force measured at the measurement point along the direction of the arrow, is extended. The maximum measured tensile force is used as a measured value which is produced empirically at an effective length of the lever arm of for instance 245 mm. In this case the point of application of force on the lever arm is 95 mm away from the edge of the wafer. In wafers which have a diameter different from 300 mm, in the determination of the adhesive force a recalculation is based on a 300 mm-diameter wafer, wherein the person skilled in the art includes both the changed lever length and also the changed length of the separation front in the calculation.

Measurement Example 2:

Determination of the Water Boundary Angle

The static water boundary angle is determined according to DIN 55660-2:2011-12.

Measurement Example 3:

Determination of the Surface Energy

The surface energy (free surface energy) is determined according to DIN 55660-2:2011-12.

Measurement Example 4:

Determination of the Water Sliding Angle

The wafer is fixed on a tilt plate. Subsequently a drop of water (deionized and particle-filtered (0.22 μm), Waters-Millipore, Milli-Q), either 50 μL, 25 μL or 10 μL, is applied to the wafer. The angle at which the drop of water begins to move slowly is determined. Overall three measurement cycles are carried out for each drop size. Preferred values extend from 10-13° for 50-μL drops of water, and/or 18-25° for 25-μL drops and/or 28-55° for 10-μL drops over the cured connecting layers, In case of doubt, the water sliding angle is determined as described in this measurement example in particular for 25 μL.

Exemplary Embodiments

Example 1

Isopropanol (IPA, 99.8% Carl Roth) (97.75% by volume), tetraethoxysilane (TEOS, ≥99.0%, Sigma-Aldrich) (0.5% by volume) and methyltrimethoxysilane (MTMS, ≥98.0%, Sigma-Aldrich) (1.5% by volume) are mixed. Next the activator (Brönsted or Lewis acid, base or fluoride ion), in this case 0.25% by volume of tetramethylammonium hydroxide (TMAH 2.38% by weight in $H_2O$, Micro Chemicals), is added.

The activity is checked before use by a dip-coat. For this purpose, an elongated (approximately 1×5 cm) part of a new untreated silicon wafer is briefly immersed in the solution. If a layer forms during drying of the precursor, the solution is suitable for spin-coating. The time until activation is a few minutes up to several days, depending upon the concentration and the activator content.

The wafer to be treated is completely covered with precursor (approximately 10 mL for a 200-mm wafer, approximately 20 mL for a 300-mm wafer) and after approximately 30 seconds standing time is spun for 20 seconds at 1000 rpm.

Subsequently the still-moist layer is tempered at 165° C. for 10 minutes, so that the layer thickness decreases from initially 60-80 nm to 40-60 nm, and the layer is solid. The water sliding angle (50-µL drops) is now 10-13°, the water contact angle (10-µL drops, static) 95-105°.

A second silicon wafer is coated with addition-crosslinking silicone adhesive, and both wafers are connected in the bonding chamber at reduced pressure (for instance 0.3 mbar) by "force-free bonding" (as described in WO 2010/061004 A1).

After 10 minutes curing of the silicone adhesive, the wafer stack can be subjected to further processes.

For separating the wafer stack, initiation takes place at one location, i.e. one small part of the wafer is detached from the other. Subsequently the lower wafer fixed on a vacuum plate is separated from a second vacuum panel. In this case the sol-gel layer remains on the device wafer, the separation takes place between the sol-gel release layer and the silicone adhesive.

For removal of this layer, the wafer is placed with agitated dipping for 10-20 minutes in a solution of 2.5% by weight tetrabutylammonium fluoride (TBAF, 97%, Sigma-Aldrich) in methylisobutyl ketone (MIBK) and is then washed with isopropanol.

Alternatively, a wafer provided with a sol-gel layer is divided into 4×4 cm pieces, and the pieces are placed in the etching solution (static dipping). The values for static dipping are lower than the values for agitated dipping and cannot be directly compared.

In this case the layer is resistant to organic solvents such as acetone, isopropanol, MIBK, gasoline, but also to water, aromatic hydrocarbons and chlorinated hydrocarbons. Only the combination of organic solvents and etching agent (TBAF) dissolved therein leads to removal.

Example 2

Alternatively Mixture for the Connecting Layer 94.15% by volume IPA
2.5% by volume TEOS
2.5% by volume MTMS
0.6% by volume Water ($H_2O$)
0.25% by volume hydrochloric acid ($HCl_{aq}$, 0.95% by weight diluted from 1M standard solution, Carl Roth)

Example 3

Alternative Mixture for the Connecting Layer 97.25% by volume isopropanol
0.5% by volume TEOS
1% by volume MTMS
1% by volume hexadecyltrimethoxysilane (HDTMS, ABCR Research Chemicals) [1641512-6] or 1H,1H, 2H,2H-perfluorooctyltrie hoxys lane (FAS, ABCR Research Chemicals) ( ) [51851-37-7]
0.25% by volume TMAH The chemicals in Examples 2 and 3 correspond to those of Example 1, unless specified otherwise.

Example 4

Water Boundary Angle

According to measurement examples 2 and 3, the following values (Table 1) were measured for the layers of Examples 1 to 3 after curing

| | Water boundary angle [°] | Water sliding angle [°] | | |
| --- | --- | --- | --- | --- |
| | | 50 µL | 25 µL | 10 µL |
| Example 1 | 84 | 12 | 21 | 40 |
| Example 2 | 80 | 13 | 25 | 52 |
| Example 3 | 91 | 11 | 22 | 48 |

Example 5

Agitated Dipping

Figure 4:
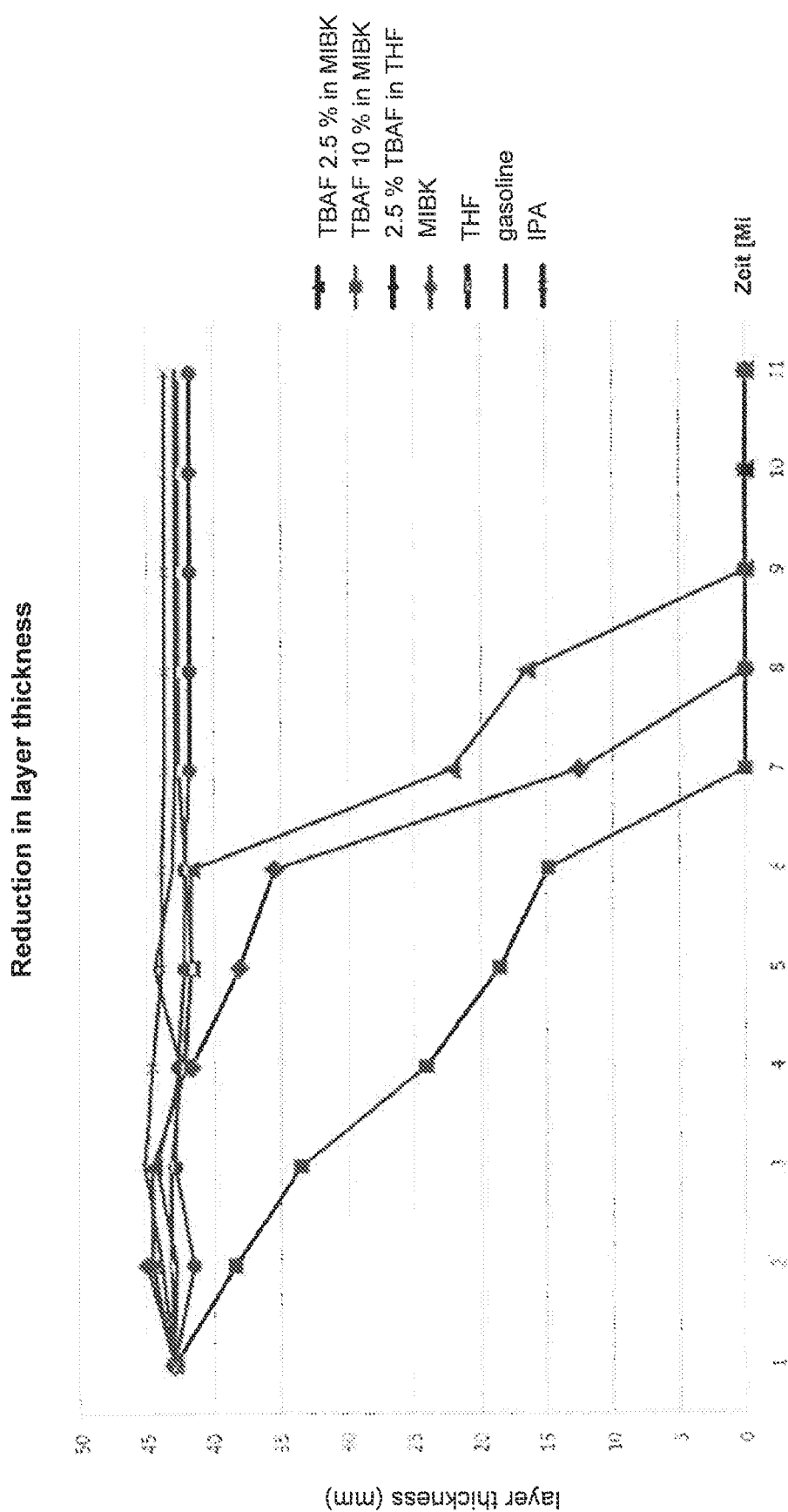
FIG. 4 is a graphical illustration showing reduction in layer thickness of a sol-gel layer while using various cleaning solutions.

The 300-mm (diameter) large wafer provided with a sol-gel layer is fixed on an agitator plate, and incubated in 300 mL cleaning solution. The cleaning solutions used can be seen from FIG. 4. Before and after the cleaning procedure the layer thickness of the sol-gel layer is determined with an interferometer, and from the action time and the reduction in layer thickness the etching rate is determined according to etching rate=reduction in layer thickness/time.

It was found that general solutions containing TBAF are preferable as cleaning agents.

Example 6

Static Dipping

A 4×4 centimeter large wafer piece provided with a sol-gel layer is placed in 50 mL etching solution. In this case a movement of the solution is omitted. The etching rate is determined according to the equation given in Example 5. Due to the lack of movement of the solution, the etching rates are lower than in the case of agitated dipping (Example 5).

The invention claimed is:

1. A wafer/support arrangement comprising:
a wafer;
a support system comprising a support and an elastomer layer, the elastomer layer being aligned with the wafer; and
a connecting layer disposed on the wafer, the connecting layer having at least one of a static water boundary angle of ≥80° and a surface energy of 15-25 mJ/m² on a side facing away from the wafer,
wherein the connecting layer is a sol-gel layer produced from the monomers (1) $Si(OR1)_4$, (2) $Si(OR1)_3R2$, (3) $Si(OR1)_2R3R4$, and (4) $Si(OR1)R5R6R7$,
where each R1 independently of the others represents H or a $C_1$-$C_8$ alkyl group, R2, R3, R4, R5, R6 and R7 in each case independently of one another represent a $C_1$-$C_{20}$ alkyl group, a fluorinated $C_1$-$C_{20}$ alkyl group, a $C_1$-$C_{20}$ aminoalkyl group, a $C_2$-$C_{20}$ alkenyl group, an aryl group, a fluorinated aryl group, a single, double or triple $C_1$-$C_4$ alkylated aryl, wherein the alkylations are independent of one another with regard to their number of C atoms and/or wherein the group can also be fluorinated, or can represent a $C_3$-$C_{20}$ epoxy group, and the molar ratio of the monomers (1) to the sum of the quantities of substance of the monomers (2), (3) and (4) is 0.032 (1:31.25) to 1.6 (1.6:1).

2. The wafer/support arrangement according to claim 1, wherein the layer thickness of the connecting layer is 10 to 200 nm.

3. The wafer/support arrangement according to claim 1, wherein each R1 independently of the others represents a $C_1$-$C_3$ alkyl group and/or R2, R3, R4, R5, R6 and R7 in each case independently of one another represent a $C_1$-$C_3$ alkyl group, a fluorinated $C_1$-$C_3$ alkyl group, a $C_2$-$C_3$ alkenyl group or phenyl group.

4. The wafer/support arrangement according to claim 1, wherein the elastomer layer is an organosilicon layer.

5. The wafer/support arrangement according to claim 1, wherein the surface with the lowest adhesive force in the arrangement is the interface between the connecting layer and the elastomer layer.

6. The wafer/support arrangement according to claim 1, wherein the wafer on the side directed towards the connecting layer comprises electronic components.

7. The wafer/support arrangement according to claim 1, wherein the support is a glass plate or a second wafer.

8. The wafer/support arrangement according to claim 1, wherein the adhesive force between the connecting layer and the elastomer layer is ≤300 N/m at a traction speed of 0.1 mm/s.

9. The wafer/support arrangement according to claim 1, wherein the connecting layer has the static water boundary angle of ≥80° on the side facing away from the wafer.

10. The wafer/support arrangement according to claim 1, wherein the connecting layer has the surface energy of 15-25 $mJ/m^2$ on the side facing away from the wafer.

11. The wafer/support arrangement according to claim 1, wherein the connecting layer has the static water boundary angle of ≥80° and the surface energy of 15-25 $mJ/m^2$ on the side facing away from the wafer.

12. A coated wafer for a wafer/support arrangement according to claim 1, wherein the coated wafer is the wafer and comprises a coating, and the coating is the connecting layer.

13. A connecting layer for the production of a wafer/support arrangement according to claim 1.

14. A method for processing the back side of a wafer, comprising the steps:
   a) providing a wafer/support arrangement according to claim 1,
   b) processing the back side of the wafer and
   c) mechanically separating the wafer/support arrangement along the interface between the elastomer layer and the connecting layer.

15. The method according to claim 14, wherein after step c) the connecting layer is chemically removed from the wafer.

* * * * *